Dec. 1, 1959 H. TYZACK 2,915,691

PUSHBUTTON SELECTOR MOTOR CONTROL SYSTEM

Filed Aug. 5, 1957 3 Sheets-Sheet 1

INVENTOR.
Harold Tyzack,
BY
Mueller and Aichele
Att'ys

PUSHBUTTON SELECTOR MOTOR CONTROL SYSTEM

Filed Aug. 5, 1957 3 Sheets-Sheet 2

INVENTOR.
Harold Tyzack,
BY
Mueller and Aichele
Attys.

PUSHBUTTON SELECTOR MOTOR CONTROL SYSTEM

Filed Aug. 5, 1957 3 Sheets-Sheet 3

INVENTOR.
Harold Tyzack,
BY Mueller and Aichele
Attys.

2,915,691

PUSHBUTTON SELECTOR MOTOR CONTROL SYSTEM

Harold Tyzack, Schiller Park, Ill., assignor to Motorola, Inc., Chicago, Ill., a corporation of Illinois Application August 5, 1957, Serial No. 676,208

8 Claims. (Cl. 318—467)

This invention relates to tuning devices and more particularly to preset tuning devices for use in conjunction with variable tuning means for television receivers and the like. The invention especially relates to tuning devices employing pushbuttons for selecting various predetermined tuning settings.

Preset tuning of television receivers having motor driven tuners has been accomplished by a sequential tuning arrangement. In this type of arrangement, it is possible to tune sequentially various preset positions corresponding to television channels. It is necessary, however, to tune in every intermediate preselected setting when passing from one station setting to another. This is often a somewhat slow and annoying procedure, particularly when changing from a channel at one end of the tuning range to one at the opposite end. Furthermore, in this type of tuning operation it is necessary to activate tuning mechanism for each change to an adjacent tuning setting. Thus, in tuning from one setting to another in instances where there are several intermediate settings, several activations of the tuning mechanism are necessary. This in addition to taking substantial time, also produces objectionable wear of the tuning mechanism.

It is an object of the present invention to provide a preset tuning mechanism for television receivers or the like wherein the receiver may be tuned from one predetermined setting to another without the necessity of going through all of the intermediate predetermined settings.

It is another object of the invention to provide a preset tuning mechanism whereby it is possible to change from one predetermined setting to another by a single activation of the tuning means despite the fact that there may be intermediate settings between the original settings and the new setting selected.

Still another object of the present invention is to provide pushbutton tuning means for a television receiver or the like wherein a predetermined channel may be selected by pushing a button without the tuning in of another of other preselected channels.

A feature of the present invention is the provision of a tuning device driven by the motor with a rotating member also being driven with the tuning device which effects disengagement of the driving motor to stop it when the tuning device has reached a certain predetermined position corresponding to a station or channel selected.

Another feature of the present invention is a switch arrangement connected to a motor which drives a tuning means so that the motor can be started or stopped by the closing and opening of switches by the depression and retraction of pushbuttons corresponding to predetermined tuning settings.

Another feature of the present invention is the provision of a camming cylinder which is driven by the motor that actuates the tuning means, with the cylinder carrying on its outer surface a number of camming lobes which are spaced both axially and angularly from one another. A switch which will stop the motor driving means when the tuning means and the cylinder have been rotated to a position corresponding to a preselected setting is positioned adjacent each of said camming lobes.

Still another feature of the present invention is electrical contact means connected to a remote control tuning means which is disengaged by depression of a pushbutton to render the remote control tuning means inoperative when pushbutton tuning of the television receiver is employed.

For a more complete understanding of the invention, reference may be had to the accompanying drawings in which.

The present invention includes motor operated tuning means connected to a driving motor through a rotatable member, a plurality of switches for starting the motor and a plurality of pushbuttons indicative of different predetermined tuning settings adjacent the switches and adapted to close the adjacent switch when depressed. The rotatable member carries disengaging means in its periphery adapted to contact pushbuttons that are in the depressed position and disengage them from their adjacent switches when the rotatable member is turned to a position corresponding to the tuning settings indicated by the depressed button. The switch is thus opened and the motor is stopped with the tuning member in the desired position.

Figure 1:
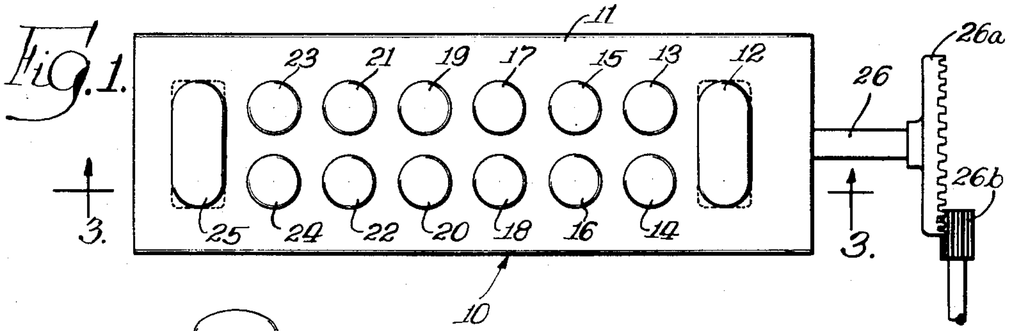
Fig. 1 is a top plan view of a tuning mechanism employing pushbuttons for the selection of predetermined settings.

Turning now to the drawings, there is illustrated in Fig. 1 a tuning mechanism generally indicated at 10 and enclosed in a generally rectangular cover 11 which is provided at its top with suitable openings for pushbuttons indicated by reference characters 12—25. The tuning mechanism is provided with a drive shaft 26 which is connected to a motor driving means (not shown) through the gears *26a* and *26b* or other suitable means.

Figure 2:
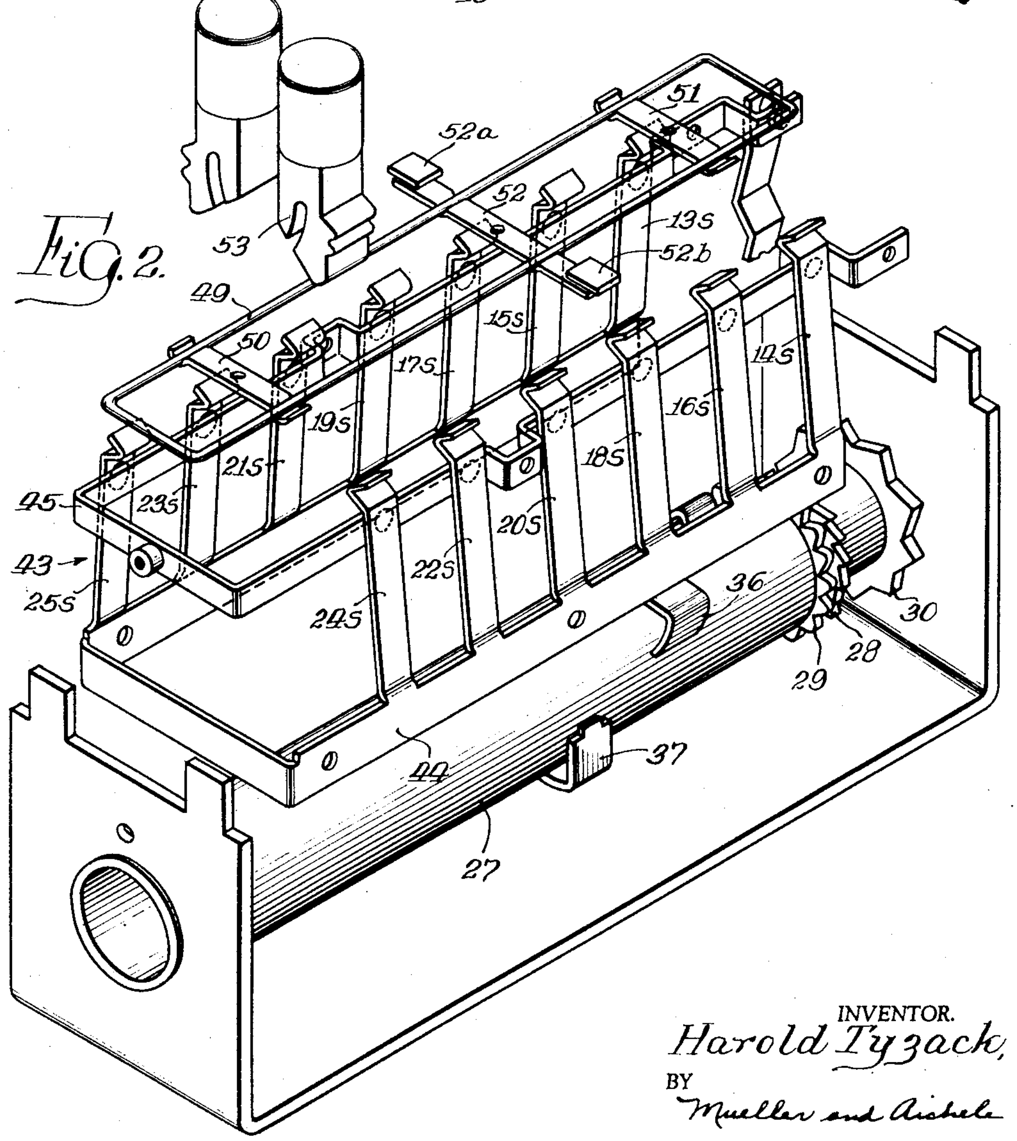
Fig. 2 is an exploded perspective view of a tuning mechanism in accordance with the present invention and showing the switching means employed displaced upwardly from the camming cylinder and also showing a pair of typical pushbuttons which are used to open and close the switches.
Figures 5, 6, 7:
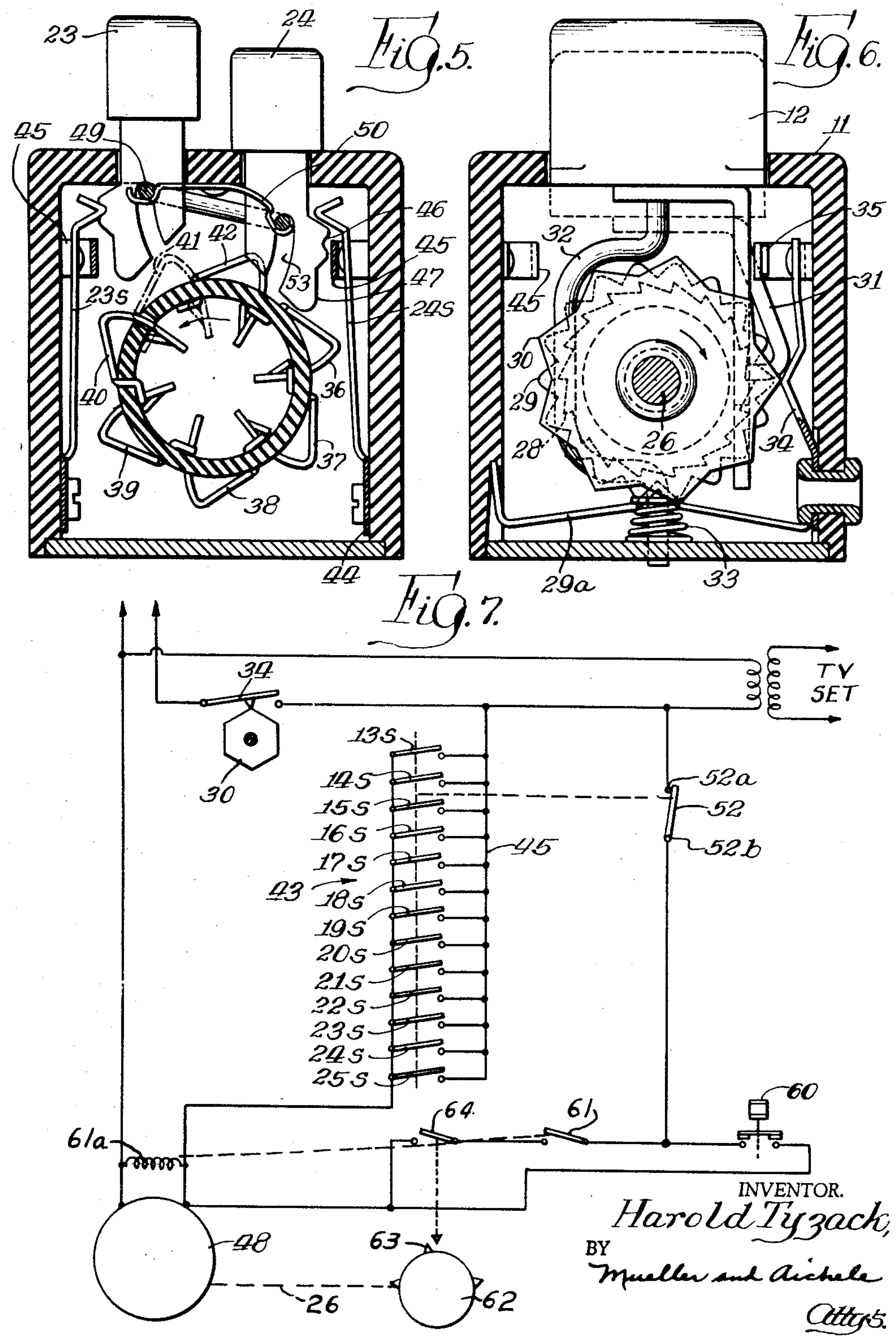
Fig. 5 is a view in section taken on the line 5—5 of Fig. 3.
Fig. 6 is a view in section taken on the line 6—6 of Fig. 3.
Fig. 7 is a schematic circuit diagram showing the tuning mechanism and its electrical connections to motor driving means and to a television receiver as well as remote tuning means that may be connected to the receiver associated with the present invention.

As shown more particularly in Figs. 2 and 6, the tuning device is provided with an axial camming shaft 27 which is cylindrical in shape and which is connected directly to the drive shaft 26 and actuated thereby. Camming shaft 27 is also connected to and actuates the tuning means (not shown). Mounted at one end of the camming shaft 27 is an assembly operative to engage and disengage the tuning mechanism 10. This assembly includes ratchet wheel 28, index wheel 29 and cam 30 which are fixed with respect to one another. This assembly is not attached to the drive shaft in any way but rotates freely with the shaft 26 as an axis. As shown particularly in Fig. 6, the starting button 12 is provided with a pawl 31 which drives the ratchet wheel 28 on depression of button 12. Pushbutton 12 is also provided with a guide rod 32 which passes through the button plate of the cover 11. A spring 33 is interposed on the guide rod 32 to return pushbutton 12 to its normal position after depression and to reposition the pawl 31 on the ratchet wheel 28. When ratchet wheel 28 turns, it turns cam 30 and moves it into or out of contact with switch blade 34. The index wheel 29 cooperates with index spring **29*a* to hold the cam 30 against the switch blade 34 and prevents the entire assembly from moving when the drive shaft 26 is rotated. The cam 30 operates the switch blade 34 causing it to make contact with the line terminal 35. The closing of this circuit connects the motor means to drive shaft 26 and through camming shaft 27** to the tuning means and connects the preset tuning assembly.

Figures 3, 4:
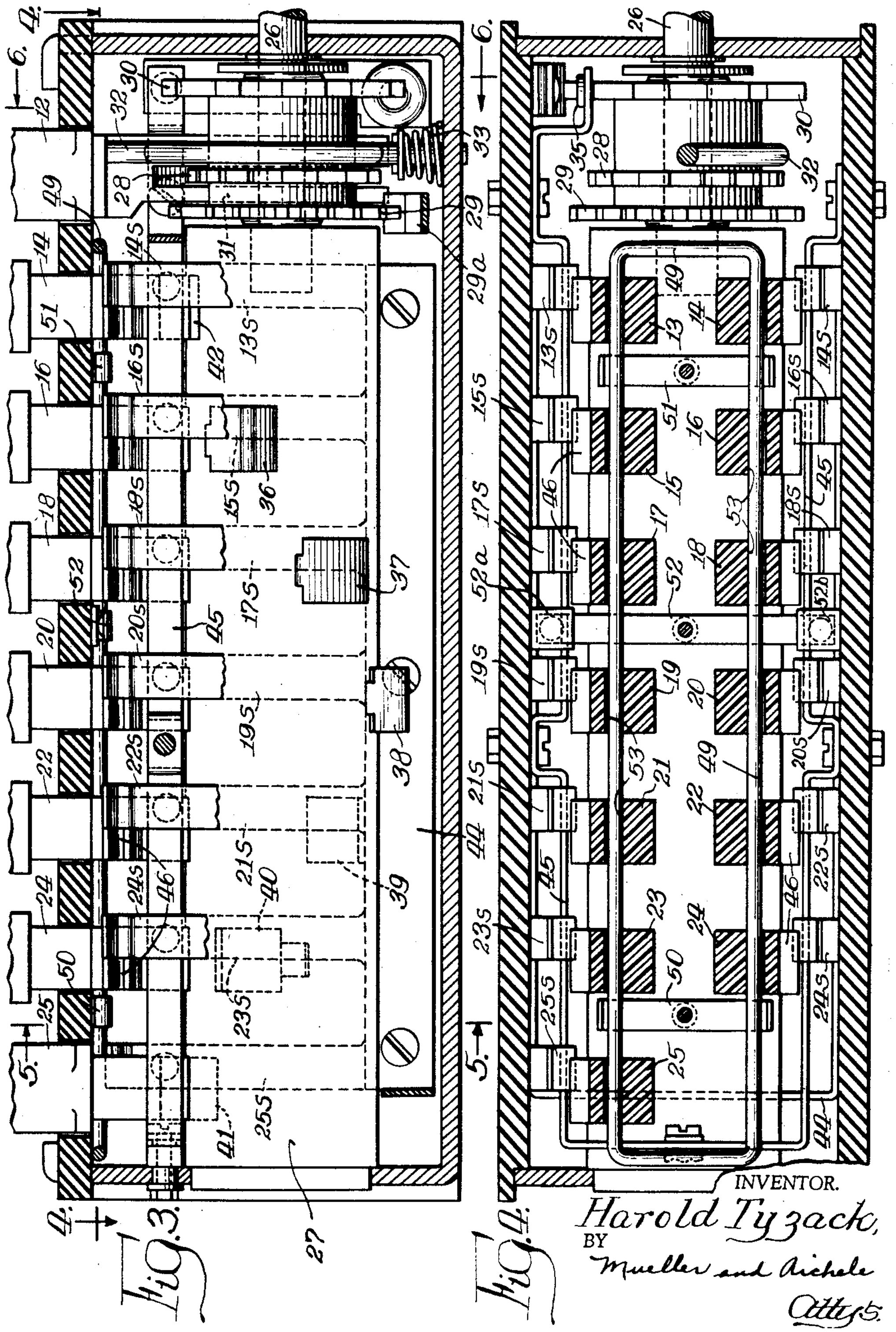
Fig. 3 is a view in section taken on the line 3—3 of Fig. 1.
Fig. 4 is a view in section taken on the line 4—4 of Fig. 3.

As shown in Figs. 2 and 5, the camming shaft 27 which rotates with drive shaft 26 carries on its surface a series of camming lobes indicated by reference characters 36 through 42. Lobe 42 is in dotted lines on Fig. 5 because of the position of the section line 5—5 of Fig. 3. These lobes are angularly and axially spaced from one another. Camming shaft 27 is partially enclosed by the switching assembly generally indicated at 43. This assembly includes lower and upper straps 44 and 45, respectively which are of a conductive metal such as copper. Attached to the lower strap 44 are flexible switch blades indicated by reference characters **13*s* through 25*s*. These switch blades are activated by pushbuttons of the corresponding reference number. As shown particularly in Fig. 5 when the buttons are in their undepressed or "up" positions, they hold their corresponding switch blades in the open position away from the strap 45 which constitutes the fixed contact for the switch. This is accomplished by means of a lip 46 in the extension 47 of each pushbutton. When a pushbutton is in its depressed or "down" position, as is pushbutton 24 in Fig. 5, the flexible switch blade associated with it, such as 24*s*, moves forward into contact with strap 45** and closes the circuit.

In operation of the tuning device, the pushbutton 12 is first depressed moving the pawl 31, ratchet wheel 28 and allowing the switch blade 34 to make contact with the electrical contact 35. A pushbutton corresponding to the channel setting desired is then depressed. This causes its corresponding switch blade to move into contact with the strap 45 and connects the motor 48 (see Fig. 7) to the tuning mechanism through the drive shaft 26 and the camming shaft 27 which begins to rotate in the direction indicated by the arrow in Fig. 5. When a camming lobe that is in the same axial position as the depressed button is moved to the position directly under the button by rotation of the camming shaft 27 it contacts the extension 47 of the button and lifts it to its "up" position. This upward movement causes the lip 46 to engage the appropriate switch blade and move it out of contact with the strap 45. This breaks the circuit, disconnects the motor 48 from the tuning device, and stops the tuner in a predetermined position. The camming lobes are so positioned on the surface of the camming shaft 27 that when they reach a disengaging position the tuner is in a desired setting corresponding to a particular television channel. When it is desired to tune in another channel the corresponding button is pressed and the camming shaft 27 continues to rotate until the corresponding lobe has reached a position where it lifts the depressed button and breaks electrical contact by moving its corresponding switch blade out of contact with strap 45.

In the aspect of the invention illustrated, the camming lobes 36 through 42 are flexible metal projections secured to a hollow camming shaft 27 through holes in the surface thereof. The camming lobes are made flexible so that their resilience will prevent possible jamming of the tuning mechanism if the pushbuttons become stuck against them. However, the camming lobes may be solid if the buttons are spring loaded in order to prevent such jamming as might occur by depressing the buttons too far.

In the event it is desired to incorporate a remote control tuning system whereby sequential tuning of channels is obtained into the television receiver embodying the present invention, it is desirable to provide means for rendering the remote control tuning mechanism inoperative during operation of the pushbutton tuner. In Fig. 7, a typical remote system is shown diagrammatically as including the pushbutton 60 and the motor interlock switch 61 electrically connected to the motor 48. When pushbutton 60 is depressed, camming shaft 27 and drive shaft 26 rotate to move the tuning means to the next preset position. A preset camming wheel 62 is mounted on tuning shaft 26 and turned by the motor 48. Cams 63 are adapted to open the switch 64 when camming wheel 62 reaches a desired angular position corresponding to a tuning position of shaft 26. The motor interlock switch 61 may have a winding **61*a* connected in parallel with motor 48 and operates so that the holding circuit through switch 64** is open except when the motor is energized.

In accordance with a specific embodiment of the present invention, disengagement of the remote tuning system is accomplished by providing a loop 49 which is carried on flexible supports 50 and 51 and on flexible switch blade 52 as shown particularly in Fig. 2. Switch blade 52 engages both fixed contacts **52*a* and 52*b* when the remote tuning circuit is engaged. Each of the pushbuttons is provided with a slot 53 adapted to engage the loop 49 when the pushbutton is depressed. Depression of any of the pushbuttons depresses loop 49 since the supports 50 and 51, as well as the switch blade 52, are flexible and secured at their respective midpoints to the top of cover 11. Downward movement of the loop 49 thus carries switch blade 52 out of contact with either fixed contact 52*a* or 52*b* (depending on which side of the loop 49** is depressed by a pushbutton) and this opens the circuit and disengages the remote tuning system.

From the above it will be seen that switch 52 is open only when one of the pushbuttons 13–25 is depressed. With switch 52 closed, the remote tuning system is operated by depressing pushbutton 60 momentarily. This connects the motor 48 and coil **61*a* to the power source through closed switch 52 and closed switch 34. Energizing the coil closes interlock switch 61 and the motor rotates camming wheel 62 which allows switch 64 to close by displacement of the particular cam 63 that was holding it open. Rotation of camming wheel 62 continues until the next preset cam opens switch 64 which breaks the circuit (pushbutton 60 now being released and stops motor 48**.

The embodiment of the invention hereinbefore described has particular application to the tuning of television receivers. Although only twelve television channels can be received at ordinary frequencies, thirteen pushbuttons for tuning settings have been shown. Pushbutton 25, which is shown in Fig. 1 as the same size as "on-off" button 12 and is larger than the other pushbuttons. Pushbutton 25 may be used for ultra-high frequency reception. Upon its depression, the camming shaft 27 rotates until the receiver has been tuned to the ultra-high frequency range at which point the pushbutton 25 engaged by the lobe 42 thus stopping the tuning motor.

Although the aspect of the invention shown in the drawings illustrates the buttons as arranged in a pair of parallel rows it will be of course, understood that other button arrangements are within the scope of the invention. For example, the buttons could be arranged in a single straight line and in which instance a single camming lobe would be provided for each button. Under the present arrangement each pair of buttons is operated by a single lobe.

The present invention provides a preset tuning mechanism in which it is possible to tune from one preselected setting to another directly without tuning in intermediate preselected settings. The tuning operation is extremely convenient and simple and provides for quicker tuning than conventional or sequential automatic tuning means. Moreover, the mechanism uses relatively few parts and is easy to manufacture.

Although the mechanism is particularly adapted to the tuning of television receivers, it will be of course understood that it may be employed in the tuning of other devices such as radios wherein a motor driven tuner is employed.

I claim:

1. A preset tuning mechanism for actuating variable tuning means including a rotatable member operatively connected to said tuning means, motor means for tuning said rotatable member, a plurality of switches for starting said motor means when closed, a plurality of pushbuttons indicative of different predetermined tuning settings adjacent said switches, each pushbutton adapted to engage and close the adjacent switch when depressed, a plurality of disengaging means carried on the periphery of said rotatable means and spaced from one another along the direction of rotation of said rotatable member, each of said disengaging means adapted to contact a pushbutton when depressed and to disengage it from the adjacent switch to open said switch and stop said motor when the tuning means reaches a predetermined setting.

2. A preset tuning mechanism including variable tuning means, a rotatable member actuating said tuning means, motor means for tuning said rotatable member, switch means for starting said motor means when closed, pushbutton means indicative of a predetermined tuning position adapted to engage said switch means to start said motor means and turn the rotatable member when said pushbutton means is depressed, and a plurality of protuberances carried on said rotatable member each at a different angular position on said rotatable member corresponding to a predetermined preset position of said tuning means, each of said protuberances adapted to engage the pushbutton means associated with the same preset tuning position when it is depressed and to cause disengagement of said switch and motor means when said rotatable member is in the angular position corresponding to the preset tuning position.

3. A preset tuning mechanism for controlling variable tuning means including a rotatable camming cylinder operatively connected to said tuning means, a motor for rotating said cylinder about its axis and actuating said tuning means, a pushbutton indicative of a predetermined tuning setting adjacent each switch and adapted to engage and close the adjacent switch and start the motor means when depressed, a plurality of lobes on the periphery of said camming cylinder spaced axially and circumferentially from one another, each of said lobes adapted to contact a depressed pushbutton and disengage it from the adjacent switch when the tuning setting indicated by said depressed pushbutton is reached by said tuning means to stop said motor.

4. A preset tuning mechanism for controlling variable tuning means including a rotatable camming cylinder operatively connected to said tuning means, a motor for rotating said cylinder about its axis and actuating said tuning means, a row of switches parallel to the axis of said cylinder for starting said motor when closed, a row of pushbuttons parallel to the axis of said cylinder with a pushbutton adjacent each switch and indicative of a predetermined tuning setting and adapted to close the adjacent switch when depressed, a plurality of lobes on the periphery of said camming cylinder spaced axially and circumferentially from one another, each of said lobes adapted to contact a depressed pushbutton and disengage it from the adjacent switch when the tuning setting indicated by the depressed pushbutton is reached by said tuning means to stop said motor.

5. A preset tuning mechanism for controlling variable tuning means including a housing having rectangular sides and top, a rotatable camming cylinder within said housing operatively connected to said tuning means, a motor for rotating said cylinder about its axis and actuating said tuning means, a pair of rows of switches positioned on the inner surfaces of the sides of said housing and parallel to the axis of said cylinder for starting said motor when closed, a double row of pushbuttons, each pushbutton indicative of a predetermined tuning setting, positioned in the top of said housing and extending inside said housing with a pushbutton adjacent each switch and adapted to close the adjacent switch when depressed, a plurality of lobes on the periphery of said camming cylinder spaced axially and circumferentially from one another, each of said lobes adapted to contact a corresponding depressed pushbutton and disengage it from the adjacent switch when the tuning setting indicated by the depressed pushbutton is reached by said tuning means to stop said motor.

6. A preset timing mechanism for controlling variable tuning means including a housing having rectangular sides and top, a rotatable camming cylinder within said housing operatively connected to said tuning means, a motor for rotating said cylinder about its axis and activating said tuning means, two parallel rows of switches, one positioned on the inner surface of each side of said housing parallel to the axis of said cylinder for starting said motor when closed, each of said switches including a fixed contact and a movable, flexible contact, a double row of pushbuttons, each pushbutton indicative of a predetermined tuning setting, positioned in the top of said housing and extending inside said housing with a pushbutton adjacent each switch and engaging the corresponding flexible contact and holding it out of contact with said fixed contact when said pushbutton is in the undepressed position and releasing said flexible contact to permit it to engage the corresponding fixed contact when said pushbutton is depressed, a plurality of lobes on the periphery of said camming cylinder spaced axially and circumferentially from one another, each of said lobes adapted to lift a corresponding depressed pushbutton out of contact with the flexible member of the corresponding switch to stop said motor when the tuning setting indicated is reached by rotation of said tuning means and said camming cylinder.

7. A preset tuning mechanism for controlling variable tuning means which are also controlled by a second tuning mechanism, said mechanism including a rotatable member operatively connected to said variable tuning means, motor means for turning said rotatable member, a plurality of switches for starting said motor means when closed, a plurality of pushbuttons each indicative of a different predetermined tuning setting adjacent said switches, each pushbutton adapted to close the adjacent switch when depressed, a plurality of disengaging means carried on the periphery of said rotatable means and spaced from one another along the direction of rotation of said rotatable member, each of said disengaging means adapted to contact a pushbutton when depressed and to disengage it from the adjacent switch to open said switch and stop said motor when said tuning means reaches a predetermined setting and means adapted to disconnect said separate tuning mechanism and render it inoperative when any pushbutton is in a depressed position.

8. A preset tuning mechanism for controlling variable tuning means which are also controllable by a remote tuning mechanism including a rotatable camming cylinder operatively connected to said variable tuning means, a motor for rotating said cylinder about its axis and actuating said tuning means, a plurality of switches for starting said motor when closed, a plurality of pushbuttons each indicative of a predetermined tuning setting adjacent each switch and adapted to close the adjacent switch when depressed, a plurality of lobes on the periphery of said camming cylinder spaced axially and circumferentially from one another, each of said lobes adapted to contact a depressed pushbutton and disengage it from the adjacent switch when the tuning setting indicated by said depressed pushbutton is reached by said tuning means to stop said motor, closed loop supported adjacent said pushbutton on a flexible switch blade, a pair of stationary contacts electrically connected by said switch blade and electrically connected to said remote tuning means, said loop adapted for displacement by the depression of any of said pushbuttons to move said switch blade out of contact with one of said stationary contacts thereby breaking the electrical connection between them and disconnecting said remote tuning means so that it is inoperative to control said variable tuning means when any of said pushbuttons are in the depressed position.

No references cited.